(12) United States Patent
Yano

(10) Patent No.: US 7,961,037 B2
(45) Date of Patent: Jun. 14, 2011

(54) INTERMEDIATE POTENTIAL GENERATION CIRCUIT

(75) Inventor: Nobumitsu Yano, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/659,398

(22) Filed: Mar. 8, 2010

(65) Prior Publication Data

US 2010/0237932 A1    Sep. 23, 2010

(30) Foreign Application Priority Data

Mar. 19, 2009  (JP) ................................. 2009-067755

(51) Int. Cl.
*G05F 1/10*   (2006.01)
(52) U.S. Cl. ........................................ 327/540; 327/538
(58) Field of Classification Search ........................ None
See application file for complete search history.

(56) References Cited

U.S. PATENT DOCUMENTS

| | | | | |
|---|---|---|---|---|
| 4,309,627 A | * | 1/1982 | Tabata | 327/81 |
| 5,146,152 A | * | 9/1992 | Jin et al. | 323/280 |
| 5,581,506 A | * | 12/1996 | Yamauchi | 365/189.11 |
| 6,351,178 B1 | * | 2/2002 | Ooishi et al. | 327/541 |
| 6,781,443 B2 | * | 8/2004 | Hamamoto et al. | 327/541 |
| 6,937,088 B2 | * | 8/2005 | Hamamoto et al. | 327/541 |
| 7,176,752 B2 | * | 2/2007 | Hashimoto et al. | 327/541 |
| 7,642,843 B2 | * | 1/2010 | Riho | 327/543 |
| 2008/0012629 A1 | * | 1/2008 | Byeon et al. | 327/538 |
| 2008/0259013 A1 | * | 10/2008 | Kobayashi | 345/89 |
| 2010/0231301 A1 | * | 9/2010 | Bruin | 330/257 |

FOREIGN PATENT DOCUMENTS

JP      8-171432      7/1996

\* cited by examiner

*Primary Examiner* — Thomas J Hiltunen
(74) *Attorney, Agent, or Firm* — McGinn IP Law Group, PLLC

(57) ABSTRACT

Provided is an intermediate potential generation circuit with a lower power supply potential. The intermediate potential generation circuit includes: a current mirror circuit including a first transistor and a second transistor each having a source input with a power supply potential; a current source circuit including a third transistor having a drain connected to a drain of the first transistor; a grounded source amplifier circuit including a fourth transistor having a gate input with the intermediate potential, and a drain connected to a drain of the second transistor; a parallel connection circuit including a fifth transistor connected in parallel with the first transistor, and a sixth transistor connected in parallel with the second transistor; and a source follower circuit including a seventh transistor and an eighth transistor having gates that are connected in common to each other, and connected with the drains of the second transistor and the sixth transistor.

2 Claims, 2 Drawing Sheets

INTERMEDIATE POTENTIAL GENERATION CIRCUIT

BACKGROUND OF THE INVENTION

1. Field of the Invention

The present invention relates to an intermediate potential generation circuit, and more particularly, to an intermediate potential generation circuit used for a semiconductor storage device.

2. Description of the Related Art

A dynamic random access memory (DRAM), which is one of semiconductor storage devices, includes a precharge circuit that precharges a bit line pair to an intermediate potential (½)Vcc of a power supply potential Vcc. The precharge circuit functions to precharge a sense amplifier of a cross couple type which is connected to amplify a minute voltage difference in the bit line pair, to the intermediate potential (½)Vcc. In recent years, with a demand to miniaturize diverse electronic devices and reduce electric power thereof, there is required a technology of accurately obtaining the intermediate potential (½)Vcc even if the power supply potential Vcc is low.

JP 08-171432 A discloses a related art pertaining to an intermediate potential generation circuit. FIG. 3 illustrates a configuration of the intermediate potential generation circuit disclosed in JP 08-171432 A. The intermediate potential generation circuit includes a reference potential generation section 1010 that generates two reference potentials Vref1 and Vref2, an output section 1012 that generates the intermediate potential (½)Vcc between the power supply potential Vcc and a ground potential Vss in response to those reference potentials Vref1 and Vref2, and an output node 1014.

The reference potential generation section 1010 includes a p-channel MOS transistor 1101, an n-channel MOS transistor 1102, a p-channel MOS transistor 1103, and an n-channel MOS transistor 1104. Those transistors 1101 to 1104 are connected in series between a power supply node 1100 to which the power supply potential Vcc is applied and a ground node 1200 to which the ground potential Vss is applied.

The p-channel MOS transistor 1101 has a source electrode connected to the power supply node 1100, and a gate electrode connected to the output node 1014. A back gate electrode of the p-channel MOS transistor 1101 is connected commonly to the source electrode. The n-channel MOS transistor 1102 has a drain electrode and a gate electrode connected to a drain electrode of the p-channel MOS transistor 1101. The drain electrode and the gate electrode of the n-channel MOS transistor 1102 are connected to each other. That is, the n-channel MOS transistor 1102 is diode-connected. The p-channel MOS transistor 1103 has a source electrode connected to a source electrode of the n-channel MOS transistor 1102, and a drain electrode and a gate electrode which are connected to each other. That is, the p-channel MOS transistor 1103 is diode-connected. A back gate electrode of the p-channel MOS transistor 1103 is connected commonly to the source electrode thereof. The n-channel MOS transistor 1104 has a drain electrode connected to the source electrode and the gate electrode of the p-channel MOS transistor 1103, a source electrode connected to the ground node 1200, and a gate electrode connected to the output node 1014. A substrate potential VBB lower than the ground potential Vss is applied to the back gate electrodes of the n-channel MOS transistors 1102 and 1104. The structure of the p-channel MOS transistor 1101 is the same as that of the p-channel MOS transistor 1103. Further, the structure of the n-channel MOS transistor 1102 is the same as that of the n-channel MOS transistor 1104.

The output section 1012 includes an n-channel MOS transistor 1121 and a p-channel MOS transistor 1122. Those transistors 1121 and 1122 are connected in series between the power supply node 1100 and the ground node 1200.

The n-channel MOS transistor 1121 has a drain electrode connected to the power supply node 1100, a source electrode connected to the output node 1014, and a gate electrode connected to the drain electrode and the gate electrode of the n-channel MOS transistor 1102. A threshold voltage of the n-channel MOS transistor 1121 is set to be substantially equal to or higher than a threshold voltage Vtn of the n-channel MOS transistor 1102.

The p-channel MOS transistor 1122 has a source electrode connected to the output node 1014, a drain electrode connected to the ground node 1200, and a gate electrode connected to the drain electrode and the gate electrode of the p-channel MOS transistor 1103. A threshold voltage of the p-channel MOS transistor 1122 is set to be equal to or higher than an absolute value |Vtp| of a threshold voltage of the p-channel MOS transistor 1103.

Now, an operation of the intermediate potential generation circuit is described. In the reference potential generation section 1010, the four transistors 1101 to 1104 are symmetrically arranged with respect to the node N3. With this arrangement, the potential (½)Vcc that is just a midpoint between the power supply potential Vcc and the ground potential Vss is generated at the node N3. Further, because the n-channel MOS transistor 1102 is diode-connected, a potential higher than that at the node N3 by the threshold voltage Vtn thereof, that is, a potential (½)Vcc+Vtn higher than the intermediate potential by the threshold voltage thereof is generated at the node N1 as a reference potential Vref1.

Further, because the p-channel MOS transistor 1103 is diode-connected as well, a potential lower than that at the node N3 by the absolute value |Vtp| of the threshold voltage thereof, that is, a potential (½)Vcc−|Vtp| lower than the intermediate potential by the absolute value of the threshold voltage thereof is generated at the node N2 as a reference potential Vref2.

The reference potential Vref1 generated in the reference potential generation section 1010 is applied to the gate electrode of the n-channel MOS transistor 1121 in the output section 1012. Further, the reference potential Vref2 is applied to the gate electrode of the p-channel MOS transistor 1122. Because the threshold voltage of the n-channel MOS transistor 1121 is set to be equal to or slightly higher than the threshold voltage of the n-channel MOS transistor 1102, the n-channel MOS transistor 1121 is slightly turned on.

Further, because an absolute value of the threshold voltage of the p-channel MOS transistor 1122 is set to be equal to or slightly higher than the absolute value |Vtp| of the threshold voltage of the p-channel MOS transistor 1103, the p-channel MOS transistor 1122 is also slightly turned on. Similarly, in the output section 1012, the transistors 1121 and 1122 are symmetrically arranged, and hence the intermediate potential (½)VCC is generated at the output node 1014.

A description is given of a case where a potential (hereinafter referred to as "output potential") Vout of the output node 1014 is to be deviated from the intermediate potential (½)Vcc in the intermediate potential generation circuit. When the output potential Vout decreases, the gate potential to the source potential of the n-channel MOS transistor 1121 increases. As a result, the n-channel MOS transistor 1121 becomes smaller in conduction resistance, and a current flows from the power supply node 1100 to the output node 1014 through the transistor 1121. For that reason, the output potential Vout increases. Moreover, at this time, because the output potential Vout is applied to the gate electrode of the p-channel MOS transistor 1101, the conduction resistance of the transistor 1101 becomes smaller, and a current flows from the power supply node 1100 to the node N1 through the transistor 1101. Accordingly, when the output potential Vout decreases, the gate potential of the n-channel MOS transistor 1121 rapidly increases. As a result, the output potential Vout rapidly returns to the original intermediate potential (½)Vcc.

On the other hand, when the output potential Vout increases, the gate potential to the source potential of the p-channel MOS transistor 1122 becomes smaller, and hence the conduction resistance of the transistor 1122 becomes smaller. Accordingly, the output potential Vout decreases. Moreover, at this time, because the output potential Vout is applied to the gate electrode of the n-channel MOS transistor 1104, the conduction resistance of the transistor 1104 becomes smaller, and the potential at the node N2 rapidly decreases. Accordingly, the output potential Vout rapidly returns to the original when increasing from the intermediate potential (½)Vcc.

In the intermediate potential generation circuit disclosed in JP 08-171432 A, because the four transistors 1101 to 1104 are connected in series between the power supply potential Vcc and the ground potential Vss of the reference potential generation section 1010, the minimum operating voltage of 4*Vt (Vt is the threshold voltage) or higher is required. The threshold voltage Vth between the gate and the source of the MOS transistor, that is, a minimum voltage required for allowing a current to flow between the source and the drain of the MOS transistor is normally about 0.5 V, and therefore the minimum operating voltage in the reference potential generation section 1010 is 4*Vt 2 V or more.

As described above, with power saving of the system device such as a cellular phone, the demand to decrease the voltage in a semiconductor integrated device has been increased. In a DRAM, which is a semiconductor storage device essential in configuring the system, in particular, a DRAM mixedly mounted on an application specific integrated circuit (ASIC), it is required to suppress the power supply potential to about 1 V or lower. For that reason, the above-mentioned configuration that requires the power supply potential of 2 V or higher cannot meet that demand.

Further, in the intermediate potential generation circuit of the above related art, the gate voltages of source followers in the output section 1012 are applied from the reference voltage generation section 1010, separately. Therefore, the respective source followers are structurally turned on, and the through current cannot be prevented from occurring. This is another factor to hinder the voltage from being decreased.

SUMMARY OF THE INVENTION

In order to solve the above-mentioned problems, an intermediate potential generation circuit according to the present invention includes: a reference potential generation circuit that generates a reference potential serving as a reference for an intermediate potential; a current mirror circuit including a first transistor and a second transistor each having a source input with a power supply potential; a current source circuit including a third transistor having a gate input with the reference potential, a source grounded, and a drain connected to a drain of the first transistor; a grounded source amplifier circuit including a fourth transistor having a gate input with the intermediate potential, a source grounded, and a drain connected to a drain of the second transistor; a parallel connection circuit including a fifth transistor having a gate input with the intermediate potential, and a source and a drain respectively connected in common to a source and the drain of the first transistor, and a sixth transistor having a gate input with the intermediate potential, and a source and a drain respectively connected in common to a source and the drain of the second transistor; and a source follower circuit including a seventh transistor and an eighth transistor having opposite carrier structures of p-type and n-type, and gates that are connected in common to each other, and connected with the drains of the second transistor and the sixth transistor.

According to the present invention, the intermediate potential is fed back to the grounded amplifier circuit and the parallel connection circuit, and a current output from the current source circuit is adjusted to adjust the intermediate potential as the occasion demands. Further, with the structure in which two transistors of one of the transistors of the current mirror circuit and the transistor of the current source circuit are connected in series between the power supply potential and the ground potential, the number of transistors connected in series is smaller than that in the conventional structure.

According to the present invention, the number of transistors connected in series between the power supply potential and the ground potential is reduced, and hence the power supply potential may be decreased.

Further, in the output section, the NMOS transistor and the PMOS transistor are connected in the source follower manner so that the respective gates of the NMOS transistor and the PMOS transistor are made common to each other, and hence the through current may be prevented.

Further, the adjustment potential generating unit is configured symmetrically in terms of circuit, and hence the reference potential serving as the reference for generating the intermediate potential may be generated with high precision without being affected by a deviation of the threshold voltage of the transistor.

DETAILED DESCRIPTION OF THE PREFERRED EMBODIMENTS

Hereinafter, a description is given of embodiments of the present invention with reference to the accompanying drawings. Parts having the same or similar effects in different embodiments are omitted from description.

First Embodiment

Figure 1:
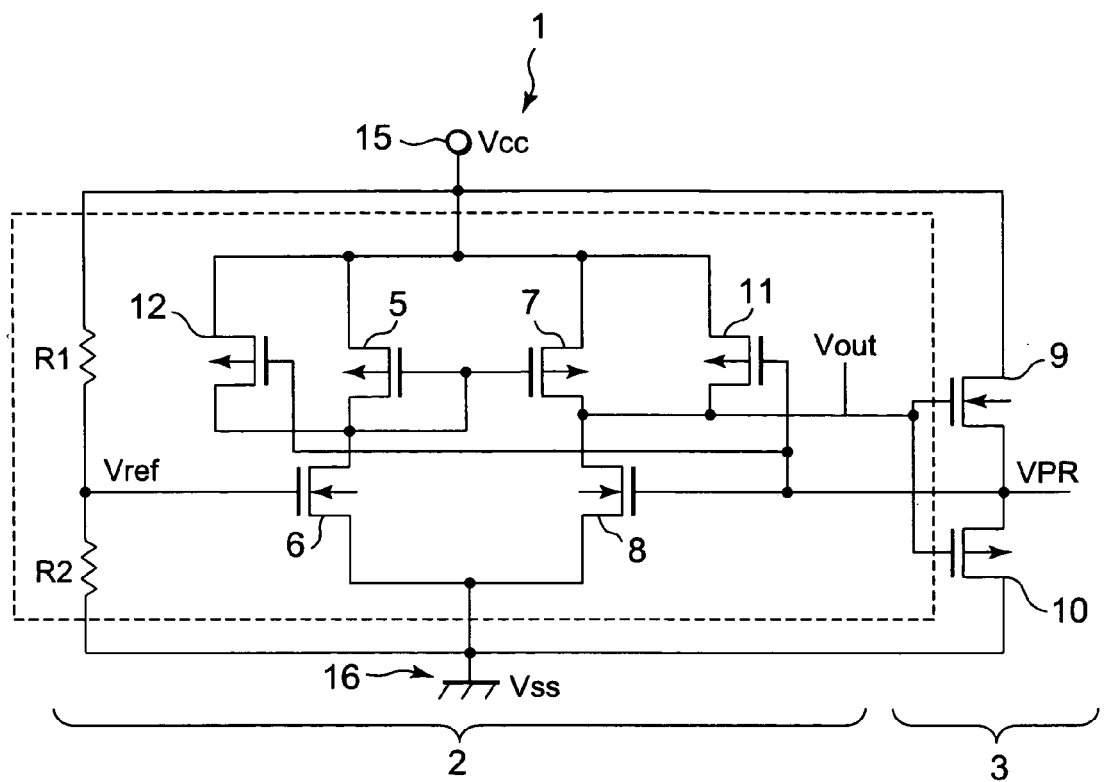
FIG. 1 is a diagram illustrating a structure of an intermediate potential generation circuit according to a first embodiment of the present invention.

FIG. 1 is a diagram illustrating a structure of an intermediate potential generation circuit 1 according to a first embodiment of the present invention. The intermediate potential generation circuit 1 includes an adjustment potential generation section 2 and an output section 3. The adjustment potential generation section 2 generates an output potential Vout for adjusting the output section 3 so that an error between a reference potential Vref and an intermediate potential VPR becomes 0. The output section 3 generates an intermediate potential (½)Vcc=VPR between a power supply voltage Vcc and a ground potential Vss in response to the output potential Vout generated by the adjustment potential generation section 2.

The adjustment potential generation section 2 includes two resistors R1 and R2, PMOS transistors 5, 7, 11, and 12, and NMOS transistors 6 and 8.

The resistors R1 and R2 are connected in series between a power supply node 15 and a ground node 16. The resistance ratio of the resistors R1 to R2 is 1:1, and the reference potential Vref=(½)Vcc is generated from a connection point (reference node) between the resistors R1 and R2. That is, the reference potential generation circuit is configured by components including those resistors R1 and R2. In this embodiment, a voltage is divided by the two resistors R1 and R2 to generate the reference potential Vref. However, the present invention is not limited to this configuration. For example, the reference potential Vref may be generated likewise by a configuration in which the resistors are replaced with MOS transistors for an operation in a triode region.

The PMOS transistor 5 and the PMOS transistor 7 have sources connected to the power supply node 15, and gates connected commonly to each other and connected to a drain of the PMOS transistor 5. That is, a current mirror circuit is configured by the PMOS transistors 5 and 7.

The NMOS transistor 6 has a drain connected to the drain of the PMOS transistor 5, a gate connected to the reference node that outputs the reference potential Vref, and a source connected to the ground node 16. As the gate-to-source potential of the NMOS transistor 6, the voltage (½)Vcc higher than the threshold voltage Vtn of the gate is supplied. That is, the NMOS transistor 6 operates as a current source circuit.

The NMOS transistor 8 has a source connected to the ground node 16, a gate connected to an output node of the intermediate potential VPR, and a drain connected to a drain of the PMOS transistor 7. That is, a grounded source amplifier circuit is configured with the NMOS transistor 8 as an active element and the PMOS transistor 7 as a load.

The PMOS transistor 12 is connected in parallel to the PMOS transistor 5, and has a source connected to the power supply node 15, a drain connected to the drains of the PMOS transistor 5 and the NMOS transistor 6, and a gate connected to the output node of the intermediate potential VPR.

The PMOS transistor 11 is connected in parallel to the PMOS transistor 7, a source connected to the power supply node 15, a drain connected to the drains of the PMOS transistor 7 and the NMOS transistor 8, and a gate connected to the output node of the intermediate potential VPR.

With the above-mentioned configuration, the output potential Vout is output from the drains of the NMOS transistor 7, the PMOS transistor 8, and the NMOS transistor 11.

The output section 3 includes an NMOS transistor 9 and a PMOS transistor 10. Those transistors 9 and 10 are connected in series between the power supply node 15 and the ground node 16. That is, a complementary source follower circuit is configured by both of those transistors 9 and 10.

The NMOS transistor 9 has a drain connected to the power supply node 15, a source connected to the output node of the intermediate potential VPR, and a gate connected to the drains of the three transistors 7, 8, and 11 in the adjustment potential generation section 2 (the output potential Vout is input to the gate).

The PMOS transistor 10 has a source connected to the output node of the intermediate potential VPR, a drain connected to the ground node 16, and a gate connected to the output potential Vout.

Now, a description is given of an operation of the intermediate potential generation circuit 1 when the potential of the output node of the intermediate potential VPR is identical with the reference potential Vref, that is, (½)Vcc.

In this case, the respective transistors 5, 6, 7, 8, 11, and 12 in the adjustment potential generation section 2 operate so that the respective left sides and the respective right sides of the following Expressions 1 and 2 are equal to each other.

(current capability of PMOS transistor 5)+(current capability of PMOS transistor 12)=(current capability of NMOS transistor 6)  Expression 1

(current capability of PMOS transistor 7)+(current capability of PMOS transistor 11)=(current capability of NMOS transistor 8)  Expression 2

Because the gate voltages of the NMOS transistors 6 and 8 are identical with (½)Vcc, a current that passes through the PMOS transistors 5 and 12 to flow into the NMOS transistor 6 and a current that passes through the PMOS transistors 7 and 11 to flow into the NMOS transistor 8 are identical with each other. That is, the voltage of the output potential Vout is about (½)Vcc.

With the above-mentioned configuration, the gate voltages of the NMOS transistor 9 and the PMOS transistor 10 in the output section 3 become smaller than threshold voltages Vt thereof, and the NMOS transistor 9 and the PMOS transistor 10 are turned off. Further, because those transistors 9 and 10 are arranged symmetrically, the intermediate potential (½) Vcc is generated in the output node.

Subsequently, a description is given of a case in which the intermediate potential VPR becomes lower than the reference potential Vref. In this time, because the gate-to-source potentials of the PMOS transistors 11 and 12 become larger, the drain currents thereof increase. Further, because the gate-to-source potential of the NMOS transistor 8 becomes smaller and the current capability thereof becomes smaller, a current that flows in the PMOS transistor 7 operating as a load (resistor) becomes smaller, and the output potential Vout increases. As a result, the intermediate potential VPR increases.

Further, the response speed at this time is determined according to currents charged in the gates of the NMOS transistor 9 and the PMOS transistor 10 in the output section 3. When the intermediate potential VPR becomes larger than the reference potential Vref, that is, when the gate-to-source potential of the NMOS transistor 8 becomes larger, currents charged in a node of the drains of the PMOS transistor 5, the PMOS transistor 12, and the NMOS transistor 6, and a node of the output potential Vout are decreased. For the purpose of compensating this decrease, the drain current of the PMOS transistor 11 increases. Therefore, no response speed goes down. Accordingly, when the intermediate potential VPR decreases, the gate potential of the NMOS transistor 9 rapidly increases, and the potential of the intermediate potential VPR rapidly returns to (½)Vcc.

On the other hand, when the intermediate potential VPR becomes larger than the reference potential Vref, the gate-to-source potentials of the PMOS transistors 11 and 12 become smaller, and the drain current decreases. Further, because the gate-to-source potential of the NMOS transistor 8 becomes larger and the current capability thereof becomes larger, a current that flows in the PMOS transistor 7 operating as the load becomes larger, and the output potential Vout decreases. As a result, the intermediate potential VPR decreases.

Also with regard to the response speed at this time, when the intermediate potential VPR increases, the gate potential of the PMOS transistor 10 rapidly decreases, and hence the intermediate potential VPR rapidly returns to (½)Vcc.

As described above, in the intermediate potential generation circuit 1 according to this embodiment, because the intermediate potential VPR is fed back by the adjustment potential generation section 2, even if the intermediate potential VPR in the output section 3 is deviated from (½)Vcc, the intermediate potential VPR rapidly returns to a regular value. Further, the PMOS transistors 11 and 12 may achieve the uniformity in the response speed to an increase or a decrease of the intermediate potential VPR for keeping the values of the reference potential Vref and the intermediate potential VPR equal to each other.

Further, in the intermediate potential generation circuit 1 according to this embodiment, two transistors are connected in series between the power supply potential Vcc (power supply node 15) and the ground potential Vss (ground node 16). For that reason, as compared with a case in which four transistors 1101, 1102, 1103, and 1104 are connected in series between the power supply potential Vcc and the ground potential Vss as in the configuration disclosed in the above related art (refer to FIG. 3 and JP 08-171432 A), a minimum operating voltage becomes smaller, and thus the power supply potential Vcc may be decreased. That is, when the number of transistors connected in series is four, the minimum operating voltage of 4*Vt (gate threshold voltage) or higher is required. On the other hand, when the number of transistors is two as in this embodiment, the minimum operating voltage may be 2*Vt or higher.

Figure 3:
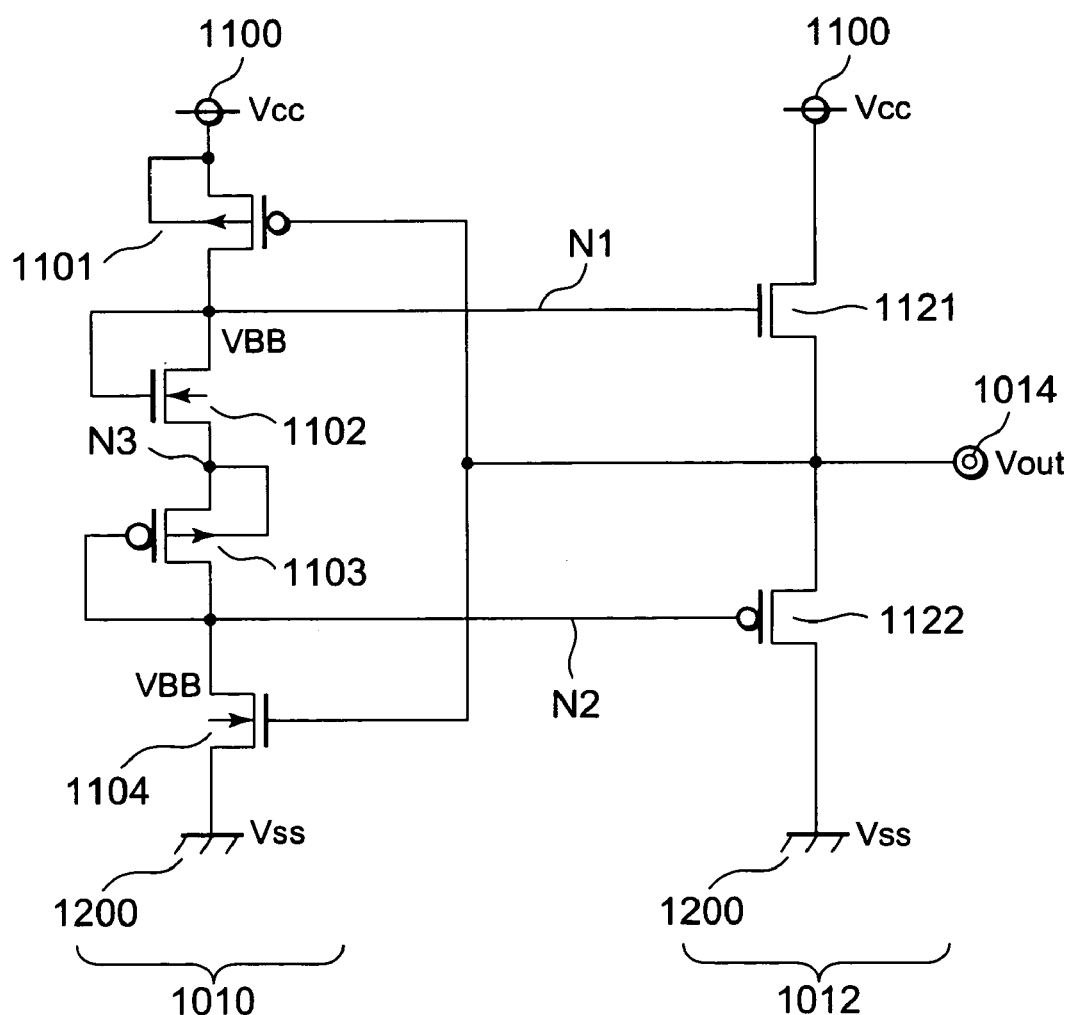
FIG. 3 is a diagram illustrating a structure of an intermediate potential generation circuit in a related art.

Further, in the related art illustrated in FIG. 3, because the gate voltages to the transistors included in the source follower circuit in the output section 1012 are supplied from the reference voltage generation section 1010, separately, the through current cannot be structurally avoided. On the other hand, in this embodiment illustrated in FIG. 1, because the gates of the NMOS transistor 9 and the PMOS transistor 10 in the output section 3 are common to each other, no through current flows therein.

Still further, in the related art illustrated in FIG. 3, because the reference voltage (½)Vcc is determined depending on the gate threshold voltage Vtp of the PMOS transistor and the gate threshold voltage Vtn of the NMOS transistor, there is high possibility that the reference voltage is deviated. On the other hand, in this embodiment illustrated in FIG. 1, because the adjustment potential generation section 2 includes circuits which are symmetrically arranged, the reference voltage (½) Vcc with high precision may be obtained without being affected by the deviation of the threshold voltage Vt of the transistor.

As described above, according to this embodiment, the power supply potential Vcc may be decreased as compared with the related art. Further, the power may be reduced by preventing the through current from occurring. Further, even if an attempt is made to decrease the voltage, a precision of the generated intermediate potential may be highly maintained.

Second Embodiment

Figure 2:
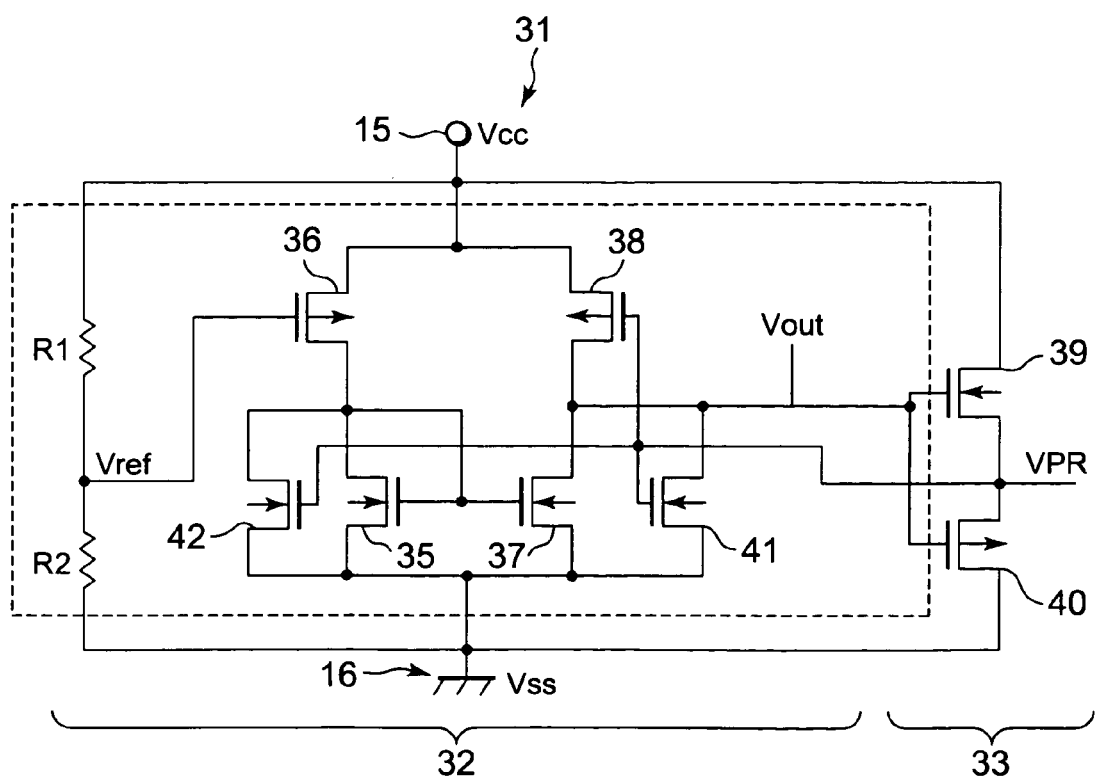
FIG. 2 is a diagram illustrating a structure of an intermediate potential gene-ration circuit according to a second embodiment of the present invention.

FIG. 2 is a diagram illustrating a structure of an intermediate potential generation circuit 31 according to a second embodiment of the present invention. The intermediate potential generation circuit 31 includes an adjustment potential generation section 32 and an output section 33.

The adjustment potential generation section 32 includes resistors R1 and R2, NMOS transistors 35, 37, 41, and 42, and PMOS transistors 36 and 38.

The NMOS transistor 35 and the NMOS transistor 37 have sources connected to the ground node 16, and gates connected commonly to each other and connected to a drain of the NMOS transistor 35. That is, a current mirror circuit is configured by the NMOS transistors 35 and 37.

The PMOS transistor 36 has a drain connected to the drain of the NMOS transistor 35, a gate connected to the connection point (reference node) of the reference potential Vref, and a source connected to the power supply node 15. As the gate-to-source potential of the PMOS transistor 36, a potential of the voltage (½)Vcc higher than the threshold voltage Vtp of the gate is supplied. That is, the PMOS transistor 36 operates as a current source circuit.

The PMOS transistor 38 has a source connected to the power supply node 15, a gate connected to the output node of the intermediate potential VPR, and a drain connected to a drain of the NMOS transistor 37. That is, a grounded source amplifier circuit is configured with the PMOS transistor 38 as an active element and the NMOS transistor 37 as a load.

The NMOS transistor 42 is connected in parallel to the NMOS transistor 35, and has a source connected to the ground node 16, a drain connected to the drains of the NMOS transistor 35 and the PMOS transistor 36, and a gate connected to the output node of the intermediate potential VPR.

The NMOS transistor 41 is connected in parallel to the NMOS transistor 37, a source connected to the ground node 16, a drain connected to the drains of the NMOS transistor 37 and the PMOS transistor 38, and a gate connected to the output node of the intermediate potential VPR.

The output section 33 includes an NMOS transistor 39 and a PMOS transistor 40. Those transistors 39 and 40 are connected in series between the power supply node 15 and the ground node 16. That is, a complementary source follower circuit is configured by those transistors 39 and 40.

The NMOS transistor 39 has a drain connected to the power supply node 15, a source connected to the output node of the intermediate potential VPR, and a gate connected to the drains of the three transistors 37, 38, and 41 in the adjustment potential generation section 32 (the output potential Vout is input to the gate).

The PMOS transistor 40 has a source connected to the output node of the intermediate potential VPR, a drain connected to the ground node 16, and a gate connected to the output potential Vout.

In order to exercise the performance of the intermediate potential generation circuit as high as possible, the respective transistors that configure the circuit may be caused to operate in a saturated region. However, for example, in the intermediate potential generation circuit 1 according to the first embodiment illustrated in FIG. 1, when the reference potential Vref or the intermediate potential VPR is to be set to be higher than (½)VCC, it is necessary to increase the gate voltage of the NMOS transistor 6 or the NMOS transistor 8. However, when the gate voltage is thus increased, margins where the NMOS transistors 5, 6, 7, and 8 are operable in the saturated region becomes smaller, and the operation in the saturated region becomes difficult. When the NMOS transistors 5, 6, 7, and 8 operate in an unsaturated region, both of the transconductances and output resistances of the respective transistors become smaller, and hence the performance as the adjustment potential generation circuit 2 is degraded.

The intermediate potential generation circuit 31 according to the second embodiment illustrated in FIG. 2 may obtain an operating point where the adjustment potential generation section 32 is operable in the saturated region, and thus may solve the above-mentioned problem. In the intermediate potential generation circuit 31, when the intermediate potential VPR is to be set to be higher than (½)Vcc, the gate voltages of the NMOS transistor 42 and the NMOS transistor 41 are set to be higher than (½)Vcc. In this time, margins where the NMOS transistors 41 and 42 are operable in the saturated region becomes smaller than those of other transistors. However, it is sufficient as long as the current capability of the NMOS transistors 41 and 42 are ensured to the degree that a reduction in current charged in the node of the output potential Vout may be compensated for, and hence there arises no essential problem. As described above, with the use of the intermediate potential generation circuit 31 according to this embodiment, even if the intermediate potential VPR is set to be higher than (½)Vcc, it is possible to surely cause the respective transistors to operate in the saturated region, and the maximum performance may be exercised.

The present invention is not limited to the above-mentioned embodiments, but may be appropriately changed without departing from the gist of the present invention.

What is claimed is:

1. An intermediate potential generation circuit, comprising:
    a reference potential generation circuit that generates a reference potential serving as a reference for an intermediate potential;
    a current mirror circuit including a first transistor and a second transistor each having a source input with a power supply potential;
    a current source circuit including a third transistor having a gate input with the reference potential, a source grounded, and a drain connected to a drain of the first transistor;
    a grounded source amplifier circuit including a fourth transistor having a gate input with the intermediate potential, a source grounded, and a drain connected to a drain of the second transistor;
    a parallel connection circuit including a fifth transistor having a gate input with the intermediate potential, and a source and a drain respectively connected in common to a source and the drain of the first transistor, and a sixth transistor having a gate input with the intermediate potential, and a source and a drain respectively connected in common to a source and the drain of the second transistor; and
    a source follower circuit including a seventh transistor and an eighth transistor having opposite carrier structures of p-type and n-type, and gates that are connected in common to each other, and connected with the drains of the second transistor and the sixth transistor.

2. An intermediate potential generation circuit according to claim 1, wherein the current mirror circuit copies the reference potential.

* * * * *